United States Patent
Lee et al.

(10) Patent No.: US 12,009,168 B2
(45) Date of Patent: Jun. 11, 2024

(54) VEHICLE AND METHOD OF CONTROLLING THE SAME

(71) Applicants: HYUNDAI MOTOR COMPANY, Seoul (KR); KIA Motors Corporation, Seoul (KR)

(72) Inventors: Joongwoo Lee, Yongin-si (KR); Man Jae Park, Hwaseong-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 802 days.

(21) Appl. No.: 17/102,849

(22) Filed: Nov. 24, 2020

(65) Prior Publication Data

US 2021/0402938 A1   Dec. 30, 2021

(30) Foreign Application Priority Data

Jun. 25, 2020   (KR) .................. 10-2020-0077806

(51) Int. Cl.
| | |
|---|---|
| H01H 47/26 | (2006.01) |
| B60R 16/00 | (2006.01) |
| B60R 16/023 | (2006.01) |
| G07C 5/08 | (2006.01) |
| B60R 16/033 | (2006.01) |
| G01R 31/327 | (2006.01) |
| H01H 50/08 | (2006.01) |

(52) U.S. Cl.
CPC .......... *H01H 47/26* (2013.01); *B60R 16/005* (2013.01); *B60R 16/0231* (2013.01); *B60R 16/0232* (2013.01); *G07C 5/0808* (2013.01); *B60R 16/033* (2013.01); *G01R 31/327* (2013.01); *H01H 50/08* (2013.01)

(58) Field of Classification Search
None
See application file for complete search history.

(56) References Cited

U.S. PATENT DOCUMENTS

| | | | |
|---|---|---|---|
| 2010/0087976 A1* | 4/2010 | Aridome | B60W 20/10 180/65.265 |
| 2013/0103349 A1* | 4/2013 | Hu | G01R 31/40 702/182 |
| 2020/0057107 A1* | 2/2020 | Cho | G01R 31/3278 |
| 2020/0209312 A1* | 7/2020 | Kim | G01R 19/32 |
| 2020/0274375 A1* | 8/2020 | Griffiths | B60R 16/033 |
| 2021/0178923 A1* | 6/2021 | Yoon | B60L 53/62 |

* cited by examiner

*Primary Examiner* — Peter D Nolan
*Assistant Examiner* — Michael F Whalen
(74) *Attorney, Agent, or Firm* — SLATER MATSIL, LLP

(57) ABSTRACT

A vehicle and a method of controlling the vehicle are provided. The method of controlling the vehicle includes detecting, by an excitation voltage computational measuring device, an excitation voltage applied to an excitation coil of a relay provided to regulate power supply of a battery; calculating, by a logical determination device, a temperature of the relay based on the excitation voltage; and calculating, by the logical determination device, a remaining life of the relay based on the calculated temperature of the relay.

14 Claims, 3 Drawing Sheets

VEHICLE AND METHOD OF CONTROLLING THE SAME

CROSS-REFERENCE TO RELATED APPLICATION(S)

The present application claims priority to and the benefit of Korean Patent Application No. 10-2020-0077806, filed on Jun. 25, 2020, the disclosure of which is incorporated by reference in its entirety.

TECHNICAL FIELD

The disclosure relates to a vehicle, and more particularly, to a vehicle having a relay that regulates the supply of battery power to the vehicle.

BACKGROUND

A high-voltage battery is an essential component as a power source for an electric vehicle or a hybrid vehicle. The high-voltage battery outputs a high voltage, so for safety, it is strictly regulated whether or not it is energized through a high-voltage relay. The high-voltage relay inevitably generates heat depending on an environmental temperature and a load, and if thermal damage continues due to this heat, the relay may be burned and a function to regulate whether or not energization may be lost.

SUMMARY

An aspect of the disclosure is to provide a vehicle capable of predicting a durability life according to heat generation and temperature change of a high-voltage relay through a voltage across an excitation coil of the high-voltage relay and preparing in advance before a failure of the high-voltage relay occurs by using information of the predicted durability life.

Additional aspects of the disclosure will be set forth in part in the description which follows and, in part, will be obvious from the description, or may be learned by practice of the disclosure.

In accordance with an aspect of the disclosure, a method of controlling a vehicle may include detecting, by an excitation voltage computational measuring device, an excitation voltage applied to an excitation coil of a relay provided to regulate power supply of a battery; calculating, by a logical determination device, a temperature of the relay based on the excitation voltage of the relay; and calculating, by the logical determination device, a remaining life of the relay based on the calculated temperature of the relay.

The method may further include calculating, by the logical determination device, the temperature of the relay using at least one of voltage-temperature data of the relay provided by a manufacturer of the relay and voltage-temperature data of the relay obtained through an experiment.

The method may further include calculating, by the logical determination device, the remaining life of the relay using a temperature difference between the temperature of the relay and a preset reference temperature, the number of high temperature diagnosis, and a S-N life curve.

In accordance with another aspect of the disclosure, a method of controlling a vehicle may include detecting, by an excitation voltage computational measuring device, an excitation voltage applied to an excitation coil of a relay provided to regulate power supply of a battery; calculating, by a logical determination device, a temperature of the relay based on the excitation voltage of the relay; calculating, by the logical determination device, a remaining life of the relay based on the calculated temperature of the relay; determining, by the logical determination device, whether a deterioration failure of the relay has occurred or entering a deterioration failure risk group based on the calculated temperature of the relay; determining, by the logical determination device, whether the relay enters the deterioration failure risk group based on the calculated remaining life of the relay; and in response to the occurrence of the deterioration failure of the relay or entering the deterioration failure risk group, outputting, by the logical determination device, a warning.

The method may further include calculating, by the logical determination device, the temperature of the relay using at least one of voltage-temperature data of the relay provided by a manufacturer of the relay and voltage-temperature data of the relay obtained through an experiment.

The method may further include calculating, by the logical determination device, the remaining life of the relay using a temperature difference between the temperature of the relay and a preset reference temperature, the number of high temperature diagnosis, and a S-N life curve.

The method may further include, in response to the calculated temperature of the relay exceeding the preset reference temperature, limiting, by the logical determination device, an output of the battery.

The method may further include, in response to the number of times that the calculated temperature of the relay exceeds the preset reference temperature exceeds a preset number of times, determining, by the logical determination device, that the deterioration failure of the relay has occurred.

The method may further include, in response to determining that the deterioration failure of the relay has occurred, stopping, by the logical determination device, the driving of the vehicle.

The method may further include, in response to determining that the relay has entered the deterioration failure risk group, displaying, by the logical determination device, the entry of the deterioration failure risk group through a display, and displaying a vehicle maintenance guide message.

In accordance with another aspect of the disclosure, a vehicle may include an excitation voltage computational measuring device configured to detect an excitation voltage applied to an excitation coil of a relay provided to regulate power supply of a battery; and a logical determination device configured to calculate a temperature of the relay based on the excitation voltage of the relay, and to calculate a remaining life of the relay based on the calculated temperature of the relay.

The logical determination device may be configured to calculate the temperature of the relay using at least one of voltage-temperature data of the relay provided by a manufacturer of the relay and voltage-temperature data of the relay obtained through an experiment.

The logical determination device may be configured to calculate the remaining life of the relay using a temperature difference between the temperature of the relay and a preset reference temperature, the number of high temperature diagnosis, and a S-N life curve.

In accordance with another aspect of the disclosure, a vehicle may include an excitation voltage computational measuring device configured to detect an excitation voltage applied to an excitation coil of a relay provided to regulate power supply of a battery; and a logical determination device configured to calculate a temperature of the relay based on the excitation voltage of the relay, to calculate a remaining life of the relay based on the calculated temperature of the relay, to determine whether a deterioration failure of the relay has occurred or entering a deterioration failure risk group based on the calculated temperature of the relay, to determine whether the relay enters the deterioration failure risk group based on the calculated remaining life of the relay, and to output a warning in response to the occurrence of the deterioration failure of the relay or entering the deterioration failure risk group.

The logical determination device may be configured to calculate the temperature of the relay using at least one of voltage-temperature data of the relay provided by a manufacturer of the relay and voltage-temperature data of the relay obtained through an experiment.

The logical determination device may be configured to calculate the remaining life of the relay using a temperature difference between the temperature of the relay and a preset reference temperature, the number of high temperature diagnosis, and a S-N life curve.

The logical determination device may be configured to limit an output of the battery, in response to the calculated temperature of the relay exceeding the preset reference temperature.

The logical determination device may be configured to determine that the deterioration failure of the relay has occurred, in response to the number of times that the calculated temperature of the relay exceeds the preset reference temperature exceeds a preset number of times.

The logical determination device may be configured to stop the driving of the vehicle, in response to determining that the deterioration failure of the relay has occurred.

The logical determination device may be configured to display the entry of the deterioration failure risk group through a display, and to display a vehicle maintenance guide message, in response to determining that the relay has entered the deterioration failure risk group.

DRAWINGS

These and/or other aspects of the disclosure will become apparent and more readily appreciated from the following description of the embodiments, taken in conjunction with the accompanying drawings of which:

DETAILED DESCRIPTION

Figure 1:
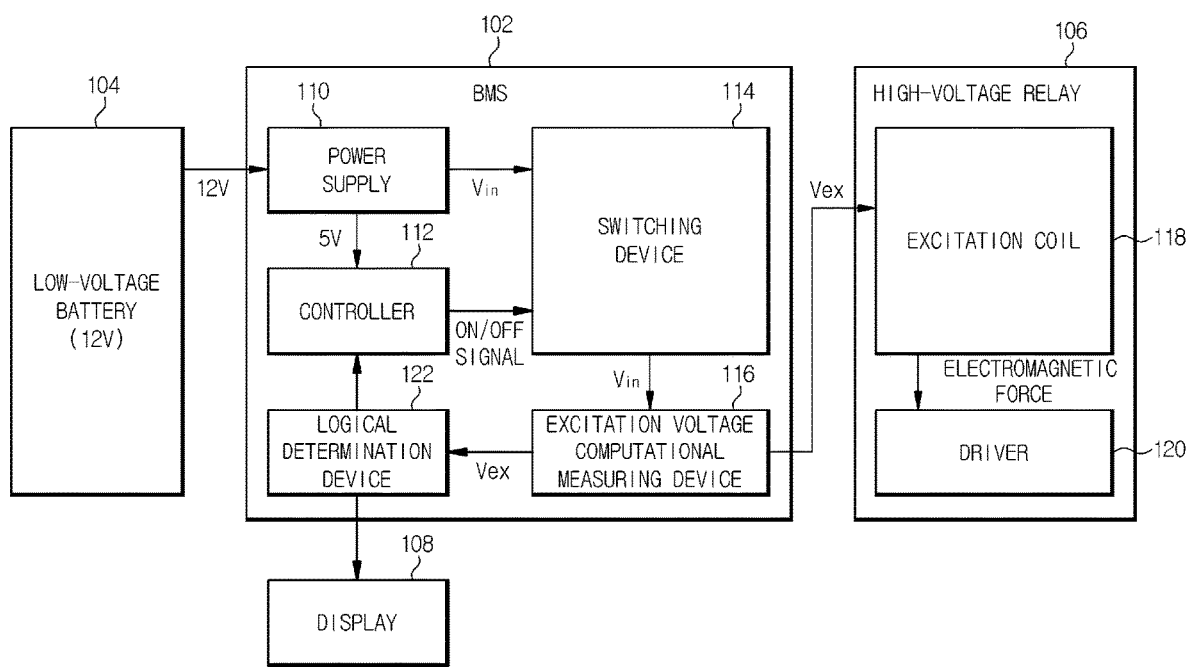
FIG. 1 is a view illustrating a control system of a vehicle in one form of the present disclosure.

FIG. 1 is a view illustrating a control system of a vehicle in some forms of the present disclosure.

A battery management system 102 of a control system illustrated in FIG. 1 may perform diagnosis of an excitation coil 118 to predict and prepare for problems that may occur in a high-voltage relay 106 and output a warning message based on a diagnosis result through a display 108 to draw a driver's attention.

In FIG. 1, the high-voltage relay 106 may supply power from a high-voltage battery to a motor of a vehicle. The high-voltage relay 106 may include the excitation coil 118 and a driver 120.

An excitation current Iex flows through the excitation coil 118, an electromagnetic force acts on the driver 120 by an action of the excitation current Iex, and the driver 120 performs a mechanical reciprocating motion, so that the high-voltage relay 106 is turned on/off. By turning of the high-voltage relay 106, a 12V voltage of a low-voltage battery 104 may be supplied to electric elements.

The battery management system 102 may include a power supply 110, a controller 112, a switching device 114, an excitation voltage computational measuring device 116, and a logical determination device 122.

The power supply 110 may receive the voltage of 12V from THE low-voltage battery 104 that is distinguished from the high-voltage battery, generate an input voltage Vin, and supply the input voltage Vin to the switching device 114. The input voltage Vin is to be applied to the excitation coil 118 of the high-voltage relay 106, and is also used to calculate a temperature and durability life after applying the voltage (current) to the excitation coil 118. In addition, the power supply 110 may generate a power supply voltage of 5V and supply the power supply voltage to the controller 112. The power supply voltage may be for operating the controller 112.

The controller 112 may generate an on/off signal for turning on/off the switching device 114 and transmit the on/off signal to the switching device 114. When the switching device 114 is turned on, the input voltage Vin may be transmitted to the excitation voltage computational measuring device 116 through the switching device 114.

The switching device 114 may be turned on in response to the generation of the on/off signal of the controller 112, thereby applying the input voltage Vin to the excitation voltage computational measuring device 116, and the excitation voltage computational measuring device 116 may apply the excitation voltage Vex to the excitation coil 118 of the high-voltage relay 106 in response to the application of the input voltage Vin.

The excitation voltage computational measuring device 116 may measure a magnitude of the excitation voltage Vex and transmit the value to the logical determination device 122 to be stored.

The logical determination device 122 may perform diagnosis of the high-voltage relay 106 based on the stored voltage data, and transmit the diagnosis result to the controller 112. The controller 112 may take measures to ensure the safety of the vehicle based on the diagnosis result provided from the logical determination device 122. For example, the controller 112 may generate a warning through the display 108 or switch a driving mode of the vehicle to a limp home mode that partially limits the performance or function of the vehicle.

Figure 2:
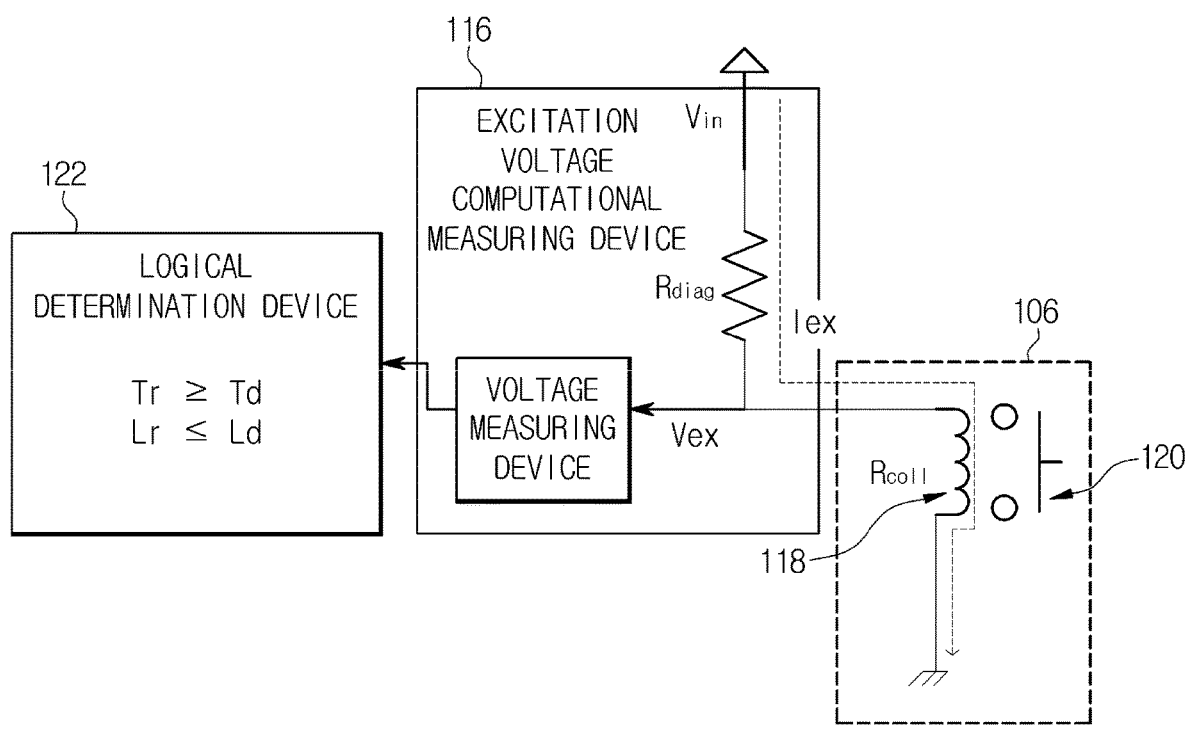
FIG. 2 is a view illustrating operations of main components for fault diagnosis of a high-voltage relay of a vehicle in one form of the present disclosure.

FIG. 2 is a view illustrating operations of main components for fault diagnosis of a high-voltage relay of a vehicle in some forms of the present disclosure.

As illustrated in FIG. 2, the excitation voltage computational measuring device 116 may be provided with a pull-up resistor Rdiag and a voltage measuring device 202 for measuring the magnitude of the excitation voltage Vex. The excitation voltage Vex may be measured by voltage distribution between a pull-up resistance Vdiag and a coil resistance Rcoil (a resistance component of the excitation coil 118). The voltage measuring device 202 may measure the voltage between the pull-up resistance Rdiag and the coil resistance Rcoil, that is, the voltage across the coil resistance Rcoil as the excitation voltage Vex, and transmit the measured value to logical determination device 122.

The logical determination device 122 may use the measurement result of the excitation voltage Vex provided from the voltage measuring device 202 of the excitation voltage computational measuring device 116 to determine whether the high-voltage relay 106 has a deterioration failure or entering a deterioration failure risk group.

The excitation coil 118 of the high-voltage relay 106 may be a form in which a copper material is wound around a magnetic material. When a failure occurs in the high-voltage relay 106 and a temperature of the driver 120 rises, the adjacent excitation coil 118 is affected by the increased temperature of the driver 120 and thus the coil resistance Rcoil of the excitation coil 118 increases.

In FIG. 2, since the magnitude of the pull-up resistor Rdiag is fixed, when a resistance value of the coil resistance Rcoil increases due to the temperature increase of the driver 120, the excitation voltage Vex across the coil resistance Rcoil may also increase. Conversely, when the resistance value of the coil resistance Rcoil decreases, the excitation voltage Vex across the coil resistance Rcoil may also decrease.

The logical determination device 122 may secure a voltage-temperature table on a data sheet provided by a manufacturer of the high-voltage relay 106 or a voltage-temperature table obtained through an experiment in advance, and convert the excitation voltage Vex measured during an actual driving of the vehicle into a relay temperature Tr based on the voltage-temperature table.

The logical determination device 122 may determine that the high-voltage relay 106 is overheated when the instantaneous relay temperature Tr is higher than the preset reference temperature Td, and limit an output of the low-voltage battery 104 Limit (limp home mode). The reference temperature Td may be preset in consideration of product specifications or experimental results of the high-voltage relay 106.

The logical determination device 122 may calculate a relay remaining life Lr using a temperature difference $\Delta T$ between the relay temperature Tr and the reference temperature Td, the number of high temperature diagnosis N, and a S-N life curve. The logical determination device 122 may provide the calculated relay remaining life Lr to a user via the display 108. When the relay remaining life Lr is less than a reference life Ld (a value set in consideration of the life distribution), the logical determination device 122 may determine that the high-voltage relay 106 is overheated and belongs to the deterioration failure risk group, generate a warning of the deterioration failure risk group, and display a guide message recommending vehicle maintenance through the display 108.

Figure 3:
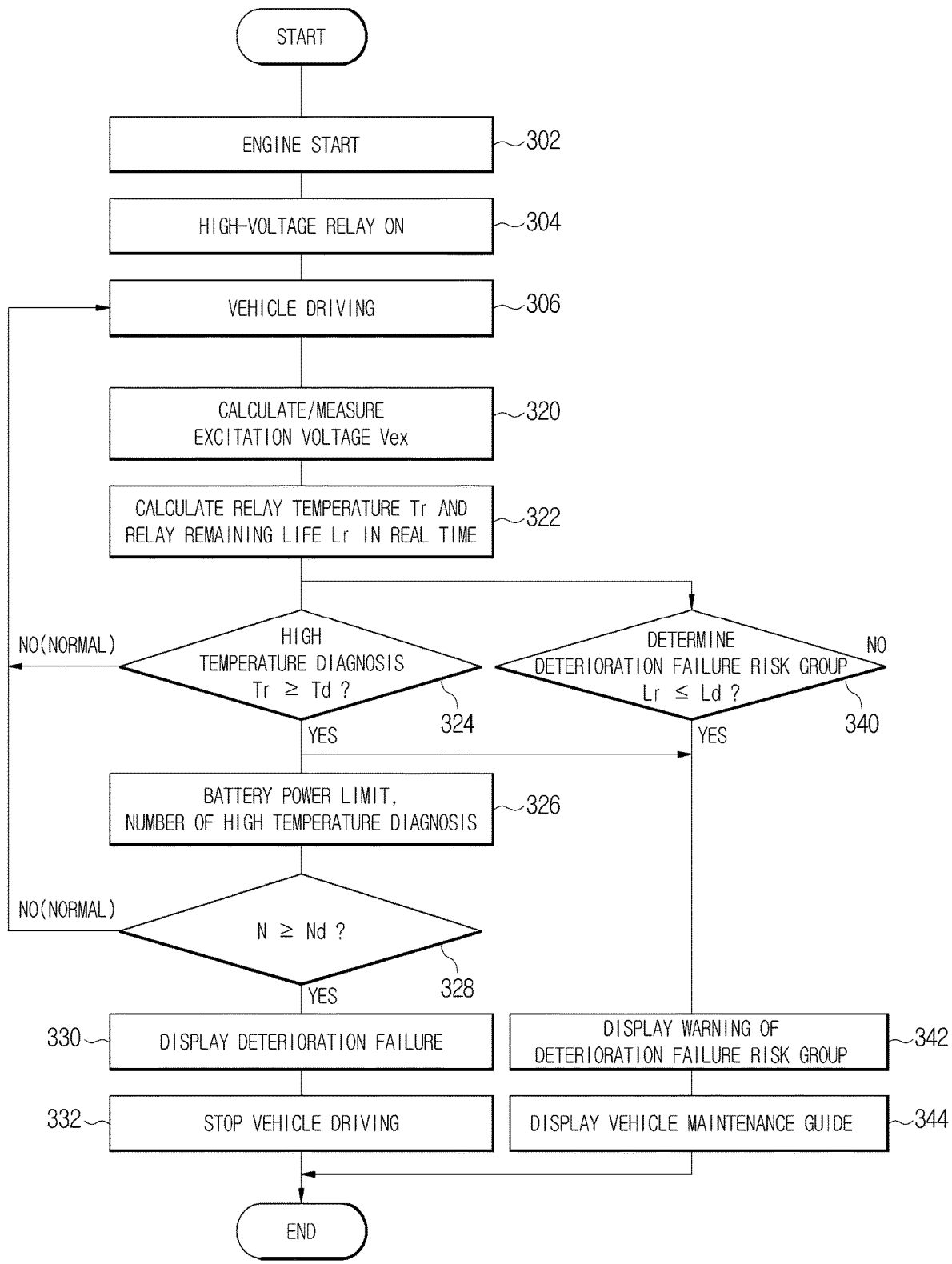
FIG. 3 is a view illustrating a method of controlling a vehicle in one form of the present disclosure.

FIG. 3 is a view illustrating a method of controlling a vehicle in some forms of the present disclosure.

Referring to FIG. 3, when an engine of the vehicle is started, the high-voltage relay 106 is turned on to supply power to the electric elements, and the vehicle may be driven (302-306).

The excitation voltage computational measuring device 116 may calculate/measure the excitation voltage Vex applied to the excitation coil 118 of the high-voltage relay 106 (308).

The logical determination device 122 may measure the relay temperature Tr of the high-voltage relay 106 based on the measured value of the excitation voltage Vex provided from the excitation voltage computational measuring device 116, and calculate the relay remaining life Lr using the temperature difference $\Delta T$ between the relay temperature Tr and the reference temperature Td, the number of high temperature diagnosis N, and the S-N life curve (322).

When the instantaneous relay temperature Tr is higher than the preset reference temperature Td (YES in 324), the logical determination device 122 may determine that the high-voltage relay 106 is overheated, limit the output of the low-voltage battery 104, and increase the number of high temperature diagnosis N to N+1 (326).

When the number of high temperature diagnosis N exceeds the reference value Nd (YES in 328), the logical determination device 122 may determine that the deterioration failure has occurred in the high-voltage relay 106 and display the occurrence of the deterioration failure of the high-voltage relay 106 through the display 108 (330). In response to the occurrence of the deterioration failure, the controller 112 may cooperate with other controllers of the vehicle to stop the driving of the vehicle (332).

In addition, when the instantaneous relay temperature Tr is higher than the preset reference temperature Td (YES in 324), the logical determination device 122 may determine that the high-voltage relay 106 is overheated and belongs to the deterioration failure risk group, generate the warning of the deterioration failure risk group (342), and display the guide message recommending vehicle maintenance through the display 108 (344).

Even if the relay remaining life Lr calculated in operation 322 is less than the preset reference life Ld (YES in 340), the logical determination device 122 may determine that the high-voltage relay 106 is overheated and belongs to the deterioration failure risk group, generate the warning of the deterioration failure risk group (342), and display the guide message recommending vehicle maintenance through the display 108 (344).

According to the embodiments of the disclosure, it is possible to predict the durability life according to heat generation and temperature change of the high-voltage relay through the voltage across the excitation coil of the high-voltage relay and prepare in advance before the failure of the high-voltage relay occurs by using information the predicted durability life.

The disclosed embodiments is merely illustrative of the technical idea, and those skilled in the art will appreciate that various modifications, changes, and substitutions may be made without departing from the essential characteristics thereof. Therefore, the exemplary embodiments disclosed above and the accompanying drawings are not intended to limit the technical idea, but to describe the technical spirit, and the scope of the technical idea is not limited by the embodiments and the accompanying drawings. The scope of protection shall be interpreted by the following claims, and all technical ideas within the scope of equivalent shall be interpreted as being included in the scope of rights.

What is claimed is:

1. A method of controlling a vehicle, the method comprising:
    detecting, by an excitation voltage computational measuring device, an excitation voltage applied to an excitation coil of a relay provided to regulate power supply of a battery;
    calculating, by a logical determination device, a temperature of the relay based on the excitation voltage;
    calculating, by the logical determination device, a remaining life of the relay using a temperature difference between the temperature of the relay and a preset reference temperature, a number of high temperature diagnosis, and a S-N life curve; and limiting, by the logical determination device, an output of the battery when the calculated temperature of the relay exceeds the preset reference temperature.

2. The method according to claim 1, further comprising: calculating, by the logical determination device, the temperature of the relay using at least one of voltage-temperature data of the relay provided by a manufacturer of the relay or voltage-temperature data of the relay obtained through an experiment.

3. A method of controlling a vehicle, the method comprising:
   detecting, by an excitation voltage computational measuring device, an excitation voltage applied to an excitation coil of a relay provided to regulate power supply of a battery;
   calculating, by a logical determination device, a temperature of the relay based on the excitation voltage;
   calculating, by the logical determination device, a remaining life of the relay using a temperature difference between the temperature of the relay and a preset reference temperature, a number of high temperature diagnosis, and a S-N life curve;
   determining, by the logical determination device, whether a deterioration failure of the relay has occurred or the relay has entered a deterioration failure risk group based on the calculated temperature of the relay;
   determining, by the logical determination device, whether the relay enters the deterioration failure risk group based on the calculated remaining life of the relay
   in response to the occurrence of the deterioration failure of the relay or entering the deterioration failure risk group, outputting, by the logical determination device, a warning; and
   limiting, by the logical determination device, an output of the battery when the calculated temperature of the relay exceeds the preset reference temperature.

4. The method according to claim 3, further comprising calculating, by the logical determination device, the temperature of the relay using at least one of voltage-temperature data of the relay provided by a manufacturer of the relay or voltage-temperature data of the relay obtained through an experiment.

5. The method according to claim 3, further comprising in response to a number of times that the calculated temperature of the relay exceeds the preset reference temperature is greater than a preset number of times, determining, by the logical determination device, that the deterioration failure of the relay has occurred.

6. The method according to claim 5, further comprising:
   in response to determining that the deterioration failure of the relay has occurred, stopping, by the logical determination device, a driving of the vehicle.

7. The method according to claim 3, further comprising:
   in response to determining that the relay has entered the deterioration failure risk group, displaying, by the logical determination device, an entry of the deterioration failure risk group through a display, and displaying a vehicle maintenance guide message.

8. A vehicle comprising:
   an excitation voltage computational measuring device configured to detect an excitation voltage applied to an excitation coil of a relay provided to regulate power supply of a battery; and
   a logical determination device configured to:
      calculate a temperature of the relay based on the excitation voltage of the relay;
      calculate a remaining life of the relay using a temperature difference between the temperature of the relay and a preset reference temperature, a number of high temperature diagnosis, and a S-N life curve; and
      limit an output of the battery when the calculated temperature of the relay exceeds the preset reference temperature.

9. The vehicle according to claim 8, wherein the logical determination device is further configured to:
   calculate the temperature of the relay using at least one of voltage-temperature data of the relay provided by a manufacturer of the relay or voltage-temperature data of the relay obtained through an experiment.

10. A vehicle comprising:
    an excitation voltage computational measuring device configured to detect an excitation voltage applied to an excitation coil of a relay provided to regulate power supply of a battery; and
    a logical determination device configured to:
       calculate a temperature of the relay based on the excitation voltage;
       calculate a remaining life of the relay using a temperature difference between the temperature of the relay and a preset reference temperature, a number of high temperature diagnosis, and a S-N life curve;
       determine whether a deterioration failure of the relay has occurred or the relay has entered a deterioration failure risk group based on the calculated temperature of the relay;
       determine whether the relay enters the deterioration failure risk group based on the calculated remaining life of the relay
       in response to the occurrence of the deterioration failure of the relay or entering the deterioration failure risk group, output a warning; and
       limit an output of the battery when the calculated temperature of the relay exceeds the preset reference temperature.

11. The vehicle according to claim 10, wherein the logical determination device is configured to:
    calculate the temperature of the relay using at least one of voltage-temperature data of the relay provided by a manufacturer of the relay or voltage-temperature data of the relay obtained through an experiment.

12. The vehicle according to claim 10, wherein the logical determination device is further configured to:
    determine that the deterioration failure of the relay has occurred when a number of times that the calculated temperature of the relay exceeds the preset reference temperature is greater than a preset number of times.

13. The vehicle according to claim 12, wherein the logical determination device is further configured to:
    stop a driving of the vehicle when it is determined that the deterioration failure of the relay has occurred.

14. The vehicle according to claim 10, wherein the logical determination device is further configured to:
    display an entry of the deterioration failure risk group through a display; and
    display a vehicle maintenance guide message when it is determined that the relay has entered the deterioration failure risk group.

* * * * *